United States Patent [19]

Chellis et al.

[11] Patent Number: 5,126,192

[45] Date of Patent: Jun. 30, 1992

[54] FLAME RETARDANT, LOW DIELECTRIC CONSTANT MICROSPHERE FILLED LAMINATE

[75] Inventors: Leroy N. Chellis, Endwell; Robert M. Japp, Vestal; William J. Summa, Endwell; William J. Rudik; David W. Wang, both of Vestal, all of N.Y.

[73] Assignee: International Business Machines Corporation, Armonk, N.Y.

[21] Appl. No.: 470,453

[22] Filed: Jan. 26, 1990

[51] Int. Cl.$^5$ .............................................. B32B 9/00
[52] U.S. Cl. ................................... 428/323; 428/209; 428/446; 428/447; 428/901; 428/402; 428/542.8; 361/397
[58] Field of Search ............... 428/209, 323, 446, 447, 428/901, 402, 542.8; 361/397

[56] References Cited

U.S. PATENT DOCUMENTS

| | | | |
|---|---|---|---|
| 3,700,538 | 9/1970 | Kennedy | 161/93 |
| 4,134,848 | 1/1979 | Adicoff et al. | 252/63.2 |
| 4,238,641 | 12/1980 | Planting et al. | 174/88 |
| 4,241,132 | 12/1980 | Pratt et al. | 428/285 |
| 4,268,337 | 5/1981 | Ibata et al. | 156/244 |
| 4,309,334 | 1/1982 | Valitsky | 260/42 |
| 4,335,180 | 6/1982 | Traut | 428/303 |
| 4,405,543 | 9/1983 | Murphy et al. | 264/123 |
| 4,447,565 | 5/1984 | Lula et al. | 523/219 |
| 4,610,495 | 9/1986 | Landi | 339/75 |
| 4,640,866 | 2/1987 | Suzuki | 428/422 |
| 4,657,809 | 4/1987 | Eskind | 428/304.4 |
| 4,661,301 | 4/1987 | Okada et al. | 264/41 |
| 4,680,220 | 7/1987 | Johnson | 428/241 |
| 4,788,230 | 11/1988 | Mudge | 523/219 |

FOREIGN PATENT DOCUMENTS 0279769 2/1987 European Pat. Off.
2195269 5/1987 United Kingdom.

OTHER PUBLICATIONS

Technical Disclosure Bulletin, vol. 31, No. 7, Dec. 1988, Fabrication of Printed Circuit Wiring Boards Using Insulation Layers With Low Dielectric Constant, by Chandrashekhar et al.
Technical Disclosure Bulletin, vol. 22, No. 5, Oct. 1979, Low Dielectric Constant Material For Printed Circuit Boards by Haining et al.
Handbook of Fillers for Plastic, published by Van Nostrand Reinhold Company, New York, 1988, edited by Katz and Milewski, pp. 437-452.
IBM Corporate Specification, Flammability Test Methods, Materials and Components/Assemblies.
IBM internal document "Characterization and Non-Destructive Testing of Thin Dielectrics".
IPC Test Methods Manual (IPC-TMM-650).
Glass Transition Temperature Peel Strength, Flexible Printed Wiring Materials.
Inner Layer Bond Strength of Multilayer Printed Circuit Boards.
Coefficient of Linear Thermal Expansion of Electrical Insulating Materials.
Dielectric Constant and Dissipation Factor of Printed Wiring Board Material-Clip Method.
Dielectric Withstanding Voltage, Printed Wiring Material Water Absorption, Metal Clad Plastic Laminates Pressure Vessel Method for Glass Epoxy Laminate Integrity.
*Principles of Electronic Packaging*, pp. 340-345, Donald P. Seraphim, Ed.
Hawley's Condensed Chemical Dictionary, 11th Ed., pp. 965 and 1001.

*Primary Examiner*—Patrick J. Ryan
*Assistant Examiner*—Kam F. Lee
*Attorney, Agent, or Firm*—Judith D. Olsen; Richard M. Goldman

[57] ABSTRACT

A flame retardant, low dielectric constant, controlled coefficient of thermal expansion, low cost prepreg material which includes randomly distributed silane coated hollow microspheres has been prepared by standard impregnation and lamination techniques. Laminates made of this prepreg can be drilled cleanly for through holes and can be used as a substrate for surface mounted devices.

13 Claims, 3 Drawing Sheets

109/CIBA/GRACE 3PLY 160X

3 PLY 105 CORE PLATED VIA.
160X

SOLDERED 452P CARD 40X

FLAME RETARDANT, LOW DIELECTRIC CONSTANT MICROSPHERE FILLED LAMINATE

BACKGROUND OF THE INVENTION

This invention relates to a material for use in electronic applications where low dielectric constant is important, and a process for making same.

More particularly, this invention relates to a material useful in a printed circuit board (PCB) structure, which may include more than one conductive layer and may incorporate electrical interconnections called blind vias, or through holes, between two or more conductive layers. This invention is also well suited for use as a substrate material for surface mounted integrated circuits.

Most particularly this invention relates to an improved material and printed circuit board made thereof comprising a coupled inorganic hollow microsphere filled, reinforced polymer resin composite material which exhibits high thermal stability, flame retardance and uniform low dielectric constant.

The necessity of developing ever-increasing high speed computers has led to the exploration of new materials which would extend the electrical and thermal performance limits of the presently available technology. For high speed applications it is necessary to have extremely dense conductor circuitry pattering on low dielectric constant insulating material. Prepreg laminates for conventional circuit boards are traditionally made up of a base reinforcing glass fabric impregnated with a resin. Epoxy/glass laminates, used in current products, typically contain about 40% by weight fiber glass and 60% by weight epoxy resin, and typically have a dielectric constant, (Er), of approximately 4.2. Such a relatively high Er causes electrical pulses (signals) present in the adjacent signal circuit lines to propagate less rapidly, resulting in excessive signal delay time. For new computer systems to become faster, system cycle times must become shorter. With the next generation of computers, the delay time contributed by signal travel within the PCB's will become very significant, hence the need for lower Er laminate materials. Future products are expected to require overall Er's of 2.8 or below. Such low Er's are impossible to obtain without new materials since the Er's of conventional FR4 epoxy and common fiber glass are typically on the order of 4 and 6 respectively. The effective Er of such composite materials can usually be approximated by a simple weighted average of the Er of each individual component and its volume fraction contained in the composite.

Pure fluoropolymers such as polytetrafluoroethylene (PTFE), have Er's of approximately 2.1. However, using such a material alone in construction of a circuit board laminate is impractical, due to its generally poor mechanical properties and chemical inertness. One alternative is to use fluoropolymer as one of the components of a composite laminate material, such as the fiber in the reinforcing cloth. An example of this is the treated PTFE fabric prepreg produced by W. L. Gore and Associates, of Newark, Del. When this type of fabric is used to replace fiber glass in conventional epoxy/glass laminates, the Er drops to 2.8. However use of this fabric presents certain disadvantages. Because of the comparatively low modulus of pure PTFE, thin laminates made with these materials are not very rigid, and require special handling care. Also when laminates incorporating PTFE fabric are drilled, uncut PTFE fibers tend to protrude into the drilled holes and are difficult to remove. In order to obtain good plating adhesion, exposed PTFE surfaces must be treated using either an expensive, highly flammable chemical in a nitrogen atmosphere or by plasma processing, which must penetrate high aspect ratio through holes in order to obtain good plating adhesion. Certainly one of the biggest disadvantages of PTFE fabric laminate is cost, not only the higher cost due to additional processing requirements and equipment modification, but also the considerable cost of purchasing the prepreg material itself.

Signal transmission delay time is to the square root of the dielectric constant of the dielectric material used, as expressed by $$T_D = \sqrt{E_r} \cdot D/C$$

where $T_D$ is the transmission delay time, Er is the dielectric constant of the material, C is the velocity of light ($3 \times 10E8$ m/sec) and D is the length of the signal path. The equation indicates that the lower the dielectric constant, the faster the signal propagation.

Ideally, the value of the Er should approach as a limit 1.0, the value in a vacuum. Lower also reduces crosstalk between adjacent circuit lines.

Another property which is in predicting the performance of a laminated dielectric material is the coefficient of thermal expansion (CTE). It is desirable to closely match the coefficients thermal expansion in the X and the Y directions of t dielectric material to that of the adjacent , which is 17 ppm, contained in the PCB in order prevent cracking of soldered joints linking the PCB a surface mounted device, or to avoid separation of copper from the dielectric, or to prevent PCB warpage. The X and Y direction CTE's are normally by the glass fibers within the matrix. However these fibers do not control Z direction CTE. Z direction CTE must also be controlled in order to prevent cracking of copper plated through holes during heat cycling. Heat is generated in preparing or reworking solder connections, and in other manufacturing processes, and during current flow when the finished board is in operation.

One way to modify the CTE is by the use of fillers. Fillers may be linked to the matrix polymer to which they are added by the use of a coupling agent, often a silane. The coupling agent improves the bonding between the filler and the polymer, minimizing the total interfacial area, which also improves both electrical and mechanical performance.

The CTE of a prepreg dielectric material changes markedly when an inflection point called the glass transition temperature (Tg) is reached. Since the expansion rate of the dielectric material increases considerably when the Tg is reached, it is desirable for a dielectric material to have a high Tg in order to minimize stresses. Epoxy novolac based dielectric materials, for example, are considered to have a relatively high Tg, generally 150 degrees C. or greater. Other characteristics associated with high Tg often include low moisture absorption and chemical inertness. A discussion of Tg is found on pp. 559-560 of *Microelectronics Packaging Handbook*, Tummala et al, Ed., published by Van Nostrand Reinhold, New York, 1989.

In order for an electronic device to be marketed commercially, it is desirable for the device to equal or exceed certain flammability standards specified by Underwriters' Laboratory (UL). Antimony and halogen compounds have been added to resins in order to impart flame retardance, such as the 19%-23% Br by weight brominated polyglycidyl ether of bisphenol A in epoxy resin, which is described in U.S. Pat. No. 3,523,037, issued Aug. 4, 1970 to Chellis et al.

SUMMARY OF THE INVENTION

It is therefore an object of the invention to provide a prepreg material suitable for use in laminated printed circuit boards, optionally in conjunction with surface mounted devices.

It is a further object of the invention to provide a prepreg material having controlled low X, Y and Z direction CTE, high Tg, low Er, excellent workability and low flammability.

It is a further object of the invention to provide a flame retardant prepreg material comprising fluoropolymer resin or other resin and microspheres, which material can be manufactured and processed using conventional impregnation techniques and equipment.

These and other objects of the present invention are achieved by an electronic packaging structure comprising a circuitized substrate, such as a printed circuit board, comprised of at least one laminate of metal clad, filled dielectric prepreg material. Optionally, the packaging structure may include a full panel flexible film chip carrier having at least one semiconductor chip, or other such electronic device, mounted thereon at bonding sites. The prepreg material of the circuitized substrate includes, preferably, a fluoropolymer or glass fabric reinforced halogenated epoxy or fluoropolymer resin, filled with silane treated hollow glass microspheres and prepared by conventional impregnation and laminating techniques, thereby being suitable for low cost manufacture on existing equipment.

Figure 1:
FIG. 1 is a photomicrograph showing the cross section of a three ply laminate containing E-Glass carrier fabric, microspheres and epoxy resin, magnified 160×.
Figure 2:
FIG. 2 is a photomicrograph showing a cross section of an additive copper plated through hole, drilled in a microsphere filled, fiber reinforced laminate, magnified 160×.
Figure 3:
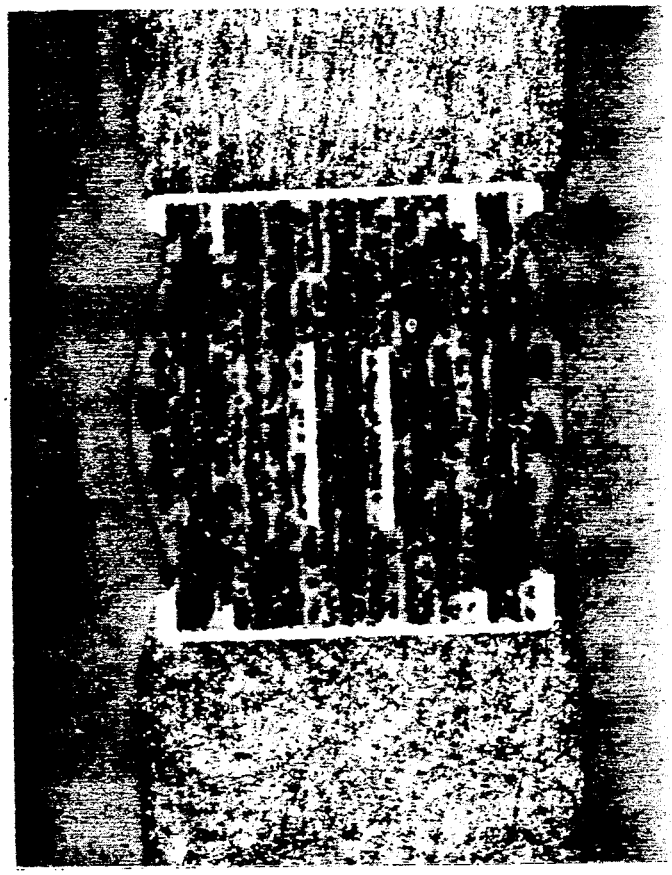
FIG. 3 is a photomicrograph showing a cross section of a soldered circuit card made entirely with laminate material described later as specific formulation #5, magnified 40×.

Thermoplastic fluoropolymer resin materials have an inherently low dielectric constant. However, the thermoplastic nature and the resulting thermal dimensional instability normally substantially prevent the use of fluoropolymers in prepreg laminates. While it is known that the presence of certain types of filler particles can improve the thermal behavior of dielectric resin materials, not all fillers have a beneficial effect on the dielectric constant. Thermosetting dielectric resin materials present many advantages over thermoplastic fluoropolymers, including better dimensional stability and processability. However, their dielectric constant is much higher. If it were possible to incorporate air as a randomly distributed filler of reproducible size and shape into a conventionally processable prepreg resin material, the dielectric constant of the resulting material would be reduced rather than raised, since the dielectric constant of air is closest to that of vacuum.

Although it has been recognized for approximately ten years that microspheres might, by incorporating air, lower the dielectric constant of a dielectric laminate, such materials are still not commercially available.

Furthermore, the addition of microspheres normally severely degrades the flame retardant properties of laminate materials. It is believed this is a direct result of the reduced specific heat of a microsphere composite. When contacted by a flame, resin on the surface of a microsphere laminate will reach the volatility temperature faster than the same material without microspheres, because of the lower specific heat. It is also believed that the lower thermal conductivity of microsphere filled laminates is a contributor to their flammability.

By use of the material of the present invention, the need for special flame retardant additives is avoided, even for very high loadings of microspheres. Since most such additives adversely effect Er, this is a significant contribution. When microsphere fillers are used, increasing the amount of halogen or antimony maintains the level of flame retardance. Circuit board laminates of the present invention have achieved a UL94 V-1 equivalent, or better, flammability rating.

Another critical property which is normally degraded by addition of microspheres is wet dielectric loss tangent, hereafter called Tan Phi. Tan Phi is critical because of its relationship to reliability. In general, a higher Tan Phi number means a lower insulation resistance reliability, within the same basic material group. Tan Phi value is an indication of the amount of water permeation into interface areas and of ionic contamination. The presence of microspheres normally has an adverse effect on Tan Phi, as the microspheres increase the interfacial area, tend to be water permeable and can contribute to ionic contamination due to leaching from the microsphere shell walls.

Tan Phi degradation due to water permeation at resin/microsphere interfaces can be minimized by selection of a water resistant resin and by coating the microspheres with a coupling agent such as the silane based compounds.

Microsphere size is also important relative to general reliability. Future circuit board designs will involve lower impedances. Lower impedances require thinner dielectric layer spacings. Obviously insulation resistance reliability will be adversely affected if laminates contain microspheres which are as large in diameter as the laminate layer is thick. In such a case, breakage of even one hollow microsphere could open a direct path through the dielectric layer. When smaller microspheres are used, reliability is improved since damage to several spheres is needed to open a pathway through the layer.

Microsphere size and size distribution also has an important influence on packing factor, particularly when very thin dielectric layers are to be made. Packing factor is the volume percent occupied by a filler. The formulations of the examples to follow call for microsphere content of approximately 45% by volume. Microsphere size and size distribution must allow sufficient packing within the thinnest required laminate layer thickness.

Considering all the previously mentioned effects of microsphere diameter, acceptable microspheres must exhibit a maximum diameter of no more than about 40 microns; with a mean diameter of no more than about 25 microns. Most preferably the microspheres should exhibit a maximum diameter of about 25 microns with a mean diameter of about 5 microns.

Dielectric laminates are most commonly made by impregnating a roll of cloth material with a resin. This is done by dipping the cloth into a tank of resin and then drying and partially curing the resin with heat. Later the impregnated cloth, or prepreg, is cut up and press laminated to copper foil forming the laminate. The same process is used when microspheres are included by the process of the present invention. In this case a mixture of resin, solvent and microspheres is used. Since the hollow microspheres have a lower density than the resin/solvent mix, they normally tend to float. However because of the small size of the microspheres of the present invention, they have little buoyancy in relation to drag due to the liquid resin, and minimal agitation, such as provided by a rotating paddle agitator, is needed to keep them fully and uniformly suspended.

The laminates of the present invention are made from the microsphere prepreg by using flat bed press or autoclave lamination. Prepreg cloth sheets are sandwiched between two sheets of copper and laminated under heat and pressure. Typically 300 PSI pressure is used. One further important property a suitable microsphere filler must exhibit is the ability to withstand the pressure of this lamination process without breaking. It is suggested that suitable microspheres must exhibit no more than 10% volume loss due to breakage at isostatic pressures of 1000 PSI. The microspheres of the present invention are expected substantially to withstand up to about 5000 PSI. Microsphere size is also important during lamination. Previous attempts to make microsphere laminates have been adversely effected by buoyancy of the microspheres during lamination. Previous microsphere laminates suffered orientated warpage when heated. It is believed that when laminated in the horizontal position, the larger microspheres would migrate toward the top surface resulting in non-random distribution. In the present invention, the microspheres, being of extremely small diameter, remain randomly distributed.

In one specific formulation, containing woven PTFE cloth, hexafluorobisphenol A dicyanate resin and microspheres, effective Er's as low as 2.2 have been obtained. The microspheres used in the above formulation have an effective Er of 1.7. Microspheres with even lower contributory Er's are available. Had this formulation been made with microspheres having an effective Er of 1.2, the Er of such a composite material would be expected to be below 2.0.

Suitable microspheres include but are not limited to those sold by 3M of Saint Paul, Minn. as 3M-X, (very small experimental microspheres), and those sold by Grace Syntactics, of Canton, Mass., designated as SDT-28 and SDT-60.

| Shell Composition | 3M-X Borosilicate | Grace SDT-28 Silica | Grace SDT-60 Silica |
|---|---|---|---|
| Effective Er | 1.7 | 1.2 | 1.4 |
| Average size (um) | 13 | 27 | 7 |
| Largest size (um) | 27 | 40 | 40 (unsieved) |
| 10% collapse (PSI) | 1300 | 1500 | 6000 |
| Void contents | $SO_2$ | $N_2$ + air | $N_2$ + air |
| Density (gr/cc) | .49 | .28 | .6 |

When sufficiently small sized microspheres are used as in the present invention, many problems previously experienced or anticipated will not occur. Benefits of very small microspheres include reduced buoyancy, random distribution, improved packing factor and enhanced electrical reliability. These advantages are gained especially when microspheres in the range of about 5 to about 25 microns are used.

As aforementioned, ionic contamination must be considered. Ionic contamination can result from using either ion contaminated resin or from ions leaching from the glass fabric or microsphere shell walls. The presence of ions in most electrical grade resins is carefully controlled and is usually not a problem. However, sodium and potassium ions are present in most glasses. It is for this reason that the levels of sodium and potassium oxide are kept below 1% in glass cloth used for electrical applications, (E-glass). The Grace Syntactics microspheres contain almost no potassium oxide and the sodium oxide level is below 2%. Low levels of these two common glass components enhance reliability performance.

The invention can be processed by known methods of vacuum lamination. A resin/silane treated microsphere/carrier structure prepreg is prepared, B-stage cured, and then vacuum laminated. The impregnation mix is prepared by adding a predetermined quantity of microspheres to the resin/solvent mixture sufficient to result in a packing factor of, for example, about 50% when the solvent is driven off. A low shear mixing technique must be used to avoid damaging the microspheres. Because they are spherical, microspheres mix in readily and do not increase the viscosity of the solution to a point beyond which impregnation could be difficult. Depending on their density and size, microspheres can be buoyant in the resin solution and require continuous low shear agitation to keep them suspended. The combination of optimum microsphere size and packing factor of the present invention enables the filled dielectric material to withstand the heat and pressure cycle of lamination without undergoing breakage of the hollow microspheres. Less than 2% microsphere breakage has been observed in the present invention with lamination pressures up to 500 PSI. When breakage does occur, the largest microspheres generally collapse first. Other properties such as shell composition, void contents, sodium content, density, and strength are also important. Hollow silica microspheres containing less than 2% sodium oxide, with 99% by population less than 40 microns in diameter, such as those marketed by Grace Syntactics, Inc. as SDT 28 are acceptable. Grace Syntactics SDT-60 microspheres sized to 99% by population below 25 microns, are the preferred filler.

The microspheres are treated with the silane-based coupling agent suitable for use with the specific resin. An especially suitable coupler for these formulations has been found to be a 1% aqueous solution of a 90/10% mixture of Dow/Corning Z-6075, Dow-Corning Z-6020 respectively. Dow/Corning Z-6032 may be used in place of Z-6020. Other couplers or coupler combinations may also be acceptable. The optimum coupler mix may be a combination of vinyl silane and amino silane, for best moisture resistance and acceptable wet dielectric loss performance. Silane resin binds the filler particles within the resin matrix and minimizes the volume of the interfacial areas between the resin matrix and the microspheres.

The carrier/reinforcement material may be any known shell type reinforcement such as glass or polytetrafluoroethylene (PTFE). The carrier fabric selected depends mostly on the properties desired for the finished laminate. These include thickness, Er, CTE, and the intended product application. Acceptable carrier materials include woven and non-woven fiber glass and polymer fabrics and mats. Organic films such as polyimide film can also be used. Low Er fabrics such as D-glass, aramids such as Kevlar and Nomex, both registered trademarks of E. I. Dupont de Nemours and Company, poly p-phenylene benzobisthiazole, poly p-phenylene benzobisoxazole, Polyetheretherketone, aromatic polyesters, quartz, S-glass, and the like, can also be used in the formulation. The reinforcement can be in a cowoven or comingled form.

Properties such as Er, Tg, water absorption, flammability, dielectric loss, melt viscosity, and gel time must all be considered in selecting the resin. In general, high functionality, low viscosity, phenolic cured, brominated epoxies are preferred. One especially suitable epoxy resin from Ciba-Geigy Inc. is Ciba-Geigy Araldite 87-212. This resin has a bromine content of about 29%. Another suitable epoxy resin is Dow XU71825 marketed by Dow Chemical Company. Arocy F-40, a fluorinated dicyanate resin, marketed by Hi-Tek Polymers Inc. is also acceptable. Blends of epoxy and Arocy F-40 have also been tested and appear to be acceptable. Resins such as Cyanates, Benzocyclobutenes, Fluoropolymers, (CTFE, PTFE, FEP, PFA), polyimides and the like, can also be used in the formulation.

The table below indicates several possible combinations of fabric/resin/microsphere in laminates. The combinations that were actually fabricated and tested are highlighted with *. Er's for the other combinations are predicted. The combinations with an * followed by (3M), denotes that this combination was made but with 3M microspheres instead of the Grace Syntactics spheres assumed in the calculations.

| Resin type (Er) | Epoxy 3.6 | Grace spheres, (1.2 Er) Dow 71787.00L 2.8 not flame retardant (non FR) | Arocy F-40 2.65 |
|---|---|---|---|
| Fabric type/Er | | Composite Er's | |
| E-glass | 6.1 | 2.77* | 2.41 | 2.34 |
| S-glass | 5.2 | 2.68 | 2.32*(3M) | 2.25* |
| D-glass | 4.0 | 2.56 | 2.20 | 2.13 |
| Quartz | 3.7 | 2.53 | 2.17 | 2.10 |
| Kevlar | 3.5 | 2.62 | 2.30 | 2.24 |
| Woven PTFE | 2.0 | 2.29 | 2.00 | 1.94*(3M) |

The calculated Er's assume fabric/resin/microsphere composition ratios of 10/45/45 vol %, respectively, for all the -non-organic fabric combinations. All of the Kevlar combinations assume composition ratios of 20/40/40 vol % and the all of the PTFE fabric combinations assume ratios of 26/37/37 vol % ratios for fabric/resin/microspheres. The above table demonstrates the significance of the PTFE/Arocy F-40 resin/microsphere formulation. Note that this is one way to achieve a dielectric constant less than 2, with a thermoset resin.

EXAMPLES

Specific Formulation #1: The following formulation and procedure were used to make a non-flame retardant laminate with an Er of 2.70. A solution containing 91.2 grams of Dow XU 71787.00L, (70% by weight resin in MEK) 0.4 grams of Zinc Octonate, (8% Zn), 43 grams of MEK and 34.5 grams of 3M experimental small microspheres was prepared. The microspheres were not silane treated. 1080 style S-glass cloth supplied by Burlington, of Altavista, Va., and treated with I-639 silane finish was impregnated with this mixture. The impregnation gap setting was 0.007 inches. The resulting fabric was B-stage cured in an oven for 4 minutes at 138 degrees C. Resin/microsphere pick-up was measured to be 60.6%. Three ply laminates with 0.0014 in. thick copper on both sides and one ten ply laminate for flammability testing were made by press lamination at 235 degrees C. at 200 PSI for 120 minutes. Flammability was tested and the specimens burned up completely resulting in failure to meet even an equivalent UL-94 V2 rating. The dielectric constants were measured using the "spectrum analyzer technique" at 304 MHz and at 596 MHz, and were found to be 2.62 and 2.73 respectively. The following table gives a detailed analysis of the composition and the resulting calculated and measured Er's of this laminate.

| Component | Finished Composition Formulation #1 | | | |
|---|---|---|---|---|
| | Ind. Er | % by weight | % by volume | Er Contribution |
| S-Glass cloth | 5.2 | 39.4% | 18.0% | .94 |
| Dow XU-71787.00L res. (non FR) | 2.8 | 4.2% | 40.0% | 1.12 |
| 3M-X microspheres | 1.7 | 18.2% | 41.6% | .71 |
| | | Calculated Er Tot. | | 2.77 |
| | | Tested Er | | 2.67 |

Specific Formulation #2: The following formulation and procedure were used to make a flame retardant laminate with an Er of 2.40. A solution containing 133 grams of Arocy F-40, (75% by weight resin in MEK), 0.12 grams of Zinc Octonate, (8% Zn), 17 grams of MEK and 14 grams of Grace Syntactics SDT-28 microspheres was prepared. The microspheres were not silane treated. 1080 style S-glass cloth supplied by Burlington, of Altavista, Va., and treated with I-639 silane finish was impregnated with this mixture. The impregnation gap setting was 0.008 inches. The resulting fabric was B-stage (i.e. partially) cured in an oven for 4 minutes at 138 degrees C. Resin/sphere pick-up was measured to be 64.8%. An 8 ply laminate with 0.0014 in. thick copper on both sides was press laminated at 320 degrees C. for 1 hour at 150 PSI. Flammability was tested. The average first and second extinguishing times were 2.1 and 0.4 seconds, giving an equivalent UL-94 V0 rating. Dielectric constant was measured using the "spectrum analyzer technique" at 555 MHz, and found to be 2.40. The following table gives a detailed analysis of the composition and the resulting calculated and tested Er's of this laminate.

| Component | Finished Composition Formulation #2 | | | |
|---|---|---|---|---|
| | Ind. Er | % by weight | % by volume | Er Contribution |
| S-Glass cloth | 5.2 | 32.2% | 16.0% | .83 |
| Arocy F-40 resin | 2.6 | 56.3% | 47.0% | 1.26 |
| Grace SDT-28 spheres | 1.2 | 8.5% | 37.6% | .45 |
| | | Calculated Er Tot. | | 2.54 |
| | | Tested Er | | 2.40 |

Specific Formulation #3: The following formulation and procedure were used to make a flame retardant laminate with an Er of 2.85. A solution containing 286 grams of Dow XU 71825.02, (70% by weight epoxy resin in MEK), 0.2 grams of 2 Methyl Imidazole, 80 grams of MEK and 36 grams of Grace Syntactics SDT-28 microspheres was prepared. The microspheres had previously been treated with a 1% solution of Dow/Corning X1-6100 silane coupler. Standard 108 Style E-Glass cloth supplied by UniGlass of New York, N.Y. and treated with UM718 silane coupler was impregnated with this mixture. The impregnation gap setting was 0.012 inches. The resulting fabric was B-stage cured in an oven for 4 minutes at 138 degrees C. Resin/microsphere pick-up was measured to be 67.8%. Prepreg flow level was tested under standard conditions, 300 PSI, 177 degrees C. for 8 minutes and found to be 31.3%. This flow level is considered excessive; the ideal flow level is thought to be around 20% for a microsphere laminate. Three ply laminates with 0.0014 in. thick copper on both sides and one ten ply laminate for flammability testing were made by press lamination at 177 degrees C. at 300 PSI for 80 minutes. Flammability was tested. Average extinguishing times for the first and second burns were 2.5 and 0.2 seconds respectively, giving an equivalent UL94-V0 rating. Tan Phi was found to be 0.149. This Tan Phi number is considered slightly high and would have been reduced if the optimum coupling agent had been applied to the spheres. The dielectric constant was measured using the "Spectrum analyzer technique" at 292 MHz and 590 MHz, and the Er's were found to be 2.90 and 2.85 respectively. Prepreg pressed thickness was found to be 0.0045 inches per ply. The following table gives a detailed analysis of the composition and the resulting Er of this laminate.

| Component | Finished Composition Formulation #3 | | | |
|---|---|---|---|---|
| | Ind. Er | % by weight | % by volume | Er Contribution |
| E-Glass cloth | 6.1 | 31.4% | 13.5% | .82 |
| Dow XU-71825 resin | 3.6 | 5.0% | 45.4% | 1.63 |
| Grace SDT-28 spheres | 1.2 | 10.5% | 40.9% | .49 |
| | | Calculated Er Tot. | | 2.94 |
| | | Tested Er | | 2.94 |

Specific Formulation #4: The following formulation and procedure were used to make a flame retardant laminate with an Er of 2.23. A solution containing 286 grams of Arocy F-40, (75% by weight epoxy resin in MEK), 0.3 grams of Zinc Octonate, (8% Zn), 70 grams of MEK and 79 grams of 3M experimental small microspheres was prepared. The microspheres had not been treated with a silane coupling agent. Woven PTFE fabric was impregnated with this mixture. The impregnation gap setting was 0.007 inches. The resulting fabric was B-stage cured in an oven for 4 minutes at 138 degrees C. Resin/microsphere pick-up was measured to be 56.8%. Prepreg flow level was not tested. One three ply laminate with 0.0014 inch thick copper on both sides and one ten ply laminate for flammability testing were made by press lamination of 320 degrees C. and 300 PSI for 60 minutes. Flammability was tested. Average extinguishing times for the first and second burns were 1.0 and 0 seconds respectively, (0 means that it did not burn) giving an equivalent UL94-V0 rating. Er was measured using the "Spectrum Analyzer technique" at 390 MHz and 796 MHz, and the Er's were found to be 2.27 and 2.19 respectively. The following table gives a detailed analysis of the composition and the resulting Er of the laminate.

| Component | Finished Composition Formulation #4 | | | |
|---|---|---|---|---|
| | Ind. Er | % by weight | % by vol. | Er Contr. |
| GORE PTFE cloth | 2.0 | 43.3% | 27.0% | .54 |
| Hexafluorobisphenol A dicyanate resin (Arocy F-40) | 2.65 | 42.0% | 36.0% | .95 |
| 3M-X spheres | 1.7 | 14.8% | 37.0% | .63 |
| | | Calculated Er Tot. | | 2.12 |
| | | Tested Er | | 2.23 |

Specific Formulation #5: The following formulation and procedure were used to make a flame retardant laminate with an Er of 2.75. A solution containing 286 grams of Ciba-Geigy Araldite* 87-212, (70% by weight epoxy resin in MEK) 0.4 grams of 2 Methyl Imidazole, 70 grams of MEK and 36 grams of Grace Syntactics SDT-28 microspheres was prepared. The microspheres had previously been treated with a 1% solution of 90/10% by weight mixture of Dow/Corning Z-6075 and Z-6020 coupling agent respectively. Standard 108 style E-Glass cloth supplied by UniGlass and treated with UM718 silane coupler was impregnated with this mixture. The impregnation gap setting was 0.012 inches. The resulting fabric was B-stage cured in an oven for 3 minutes at 143 degrees C. Resin/microsphere pick-up was measured to be 68.8%. Prepreg flow level was tested under standard conditions, 300 PSI, 177 degrees C. for 8 minutes and found to be 10.6%. Three ply laminates with 0.0014 in. thick copper on both sides and one ten ply laminate for flammability testing were made by press lamination at 177 degrees C. at 400 PSI for 90 minutes. Flammability was tested. Average extinguishing times for the first and second burns were 2.0 and 0 seconds respectively, giving an equivalent UL94-V0 rating. Tan Phi was tested and was found to be 0.092. Er was tested using the "Spectrum analyzer technique" at 312 MHz and 631 MHz, the Er's were found to be 2.83 and 2.77 respectively. Prepreg pressed thickness was found to be 0.0045 inches per ply. The following table gives a detailed analysis of the composition and the resulting Er of this laminate.

The formulations of both the liquid impregnation mix and the finished laminate are also shown below. It can be seen that although the microspheres account for only a small percentage of the total weight of the final composite material, they make up almost half of the total volume. This is due to the extremely low density of the microspheres, (0.28 g/cc), for the Grace Syntactics SDT-28 microspheres.

| Formulation #5. (impregnation mix). | |
|---|---|
| Constituents: | % by weight |
| Ciba-Geigy Araldite* 87-212 epoxy | 51.0 |
| Grace SDT'28 microspheres | 9.1 |
| 2-Methyl Imidazole | 0.1 |
| Methyl Ethyl Ketone (MEK) | 39.8 |

| Formulation #5. (finished laminate). | | |
|---|---|---|
| Constituents: | % by weight | % by volume |
| Ciba-Geigy Araldite* 87-212 epoxy | 67.1 | 45.7 |
| Grace SDT 28 microspheres | 11.9 | 45.5 |
| 106 E-glass cloth | 21.0 | 8.8 |

The above table gives amounts used for one specific formulation. The individual ingredient percentages can be varied depending on the exact properties desired for the final composite. In general the composition is a laminate comprised of 7-30 vol % reinforcing fabric and 70-93 vol % of a microsphere filled resin. The microsphere filled resin is comprised of Araldite* 87-212, 80-95 parts by weight and Grace Syntactics SDT-28 microspheres, 5-20% parts by weight and 2-Methyl Imidazole catalyst in the range of 0.1 parts per hundred of resin. Of course alternative resins, fabrics and fillers may be used. Use of lower weight fabrics of the same carrier material yields thinner prepreg pressed thicknesses. In addition UV blocking dyes are sometimes added to facilitate photolithography operations on very thin laminate cores. These UV absorbing materials can be added in the range 0.5 parts per hundred (PHR) of resin.

Below is a table which lists the fundamental properties obtained during extensive testing of the flame retardant microsphere laminate of the present invention identified as Formulation #5. Test methods used are from the IPC test methods manual, (IPC-TMM-650), unless otherwise specified.

| Other properties: | Flame Retardant Microsphere laminate (Formulation #5) | |
|---|---|---|
| Property | Result | Test method |
| Glass transition (C) | 163 | IPCTMM-2.4.25 |
| Dielectric constant | 2.8 | "spectrum analyzer technique" |
| Dissipation factor | .012 | IPCTMM-2.5.5.2 |
| Dielectric strength V/mi | 500 | IPCTMM-2.5.7 |
| Pressure vessel test | | |
| 30 min. | PASS | IPCTMM-2.6.16 |
| 45 min. | PASS | IPCTMM-2.6.16 |
| 60 min. | PASS | IPCTMM-2.6.16 |
| 90 min. | FAIL | IPCTMM-2.6.16 |
| TAN PHI | .08 | |
| Copper bond lbs/in. | 6 | IPCTMM-2.4.9 |
| Flammability | V-O | UL94 Equiv. |
| Interlaminer bond. lbs./in | 7.5 | IPCTMM-2.4.40 |
| Z CTE, ppm/c | 50 | IPCTMM-2.4.41 |
| X, Y CTE, ppm/c | 20 | IPCTMM-2.4.41 |
| 24 hr. RT moist. gain % | .41 | IPCTMM-2.6.2.1 |
| Density g/CC | 1.07 | |

When the formulation and processing as described above are employed, a fire retardant, high quality, cost competitive, reliable, low Er microsphere laminate circuit board can be manufactured which exhibits low shrink warpage on processing, low dielectric constant, low wet dissipation tangent, acceptable dielectric breakdown voltage, acceptable adhesive strength, low CTE and low moisture absorption, and which passes solder shock testing and possesses a high Tg.

While the invention has been described in detail and with respect to several illustrative, non-limiting embodiments, it will be apparent to one skilled in the art that various modifications can be made therein without departing from the spirit and scope thereof.

We claim:

1. A filled prepreg material having a dielectric constant below 3.2, comprising:
    about 37 volume percent to about 47 volume percent of at least one polymer resin selected from the group consisting of cyanate, epoxy, benzocyclobutene, polyimide, fluoropolymer and dicyanate;
    about 25 to about 65 volume percent of hollow inorganic microsphere filler wherein the hollow inorganic microspheres of the filler have a maximum diameter of less than 40 microns;
    a coupling agent; and
    about 8 to about 27 volume percent of reinforcement material, all in amounts relative to each such that the overall dielectric constant is below 3.2.

2. The prepreg material recited in claim 1 wherein the hollow inorganic microspheres of the filler are randomly distributed and exhibit a compressive strength of between about 500 to about 5000 pounds per square inch.

3. The prepreg material recited in claim 1 wherein the reinforcement material comprises a woven cloth, mat or film selected from the group consisting of glass, ceramic, fluoropolymer, polyester, quartz, polyimide, Kevlar, Nomex, poly p-phenylene benzobisthiazole, poly p-phenylene benzobisoxazole, Aramid, polyetheretherketone, and aromatic polyester.

4. The prepreg material recited in claim 1, wherein the polymer resin and hollow inorganic microsphere filler comprise a flame retardant material.

5. The prepreg material recited in claim 1, comprising in addition a UV blocking dye for rendering the laminate opaque to UV wavelength light.

6. The prepreg material recited in claim 2, wherein about 90% of the hollow inorganic microspheres of the filler are glass or silica walled and have a mean diameter between about 5 microns to about 25 microns and comprise about 2% by weight or less of sodium oxide.

7. The prepreg material recited in claim 6 wherein the hollow glass microspheres of the filler comprise from about 25 to about 65 percent by volume.

8. A printed circuit board comprising a prepreg material having a dielectric constant below 3.2, which material includes
    about 37 volume percent to about 47 volume percent of at least one polymer resin selected from the group consisting of cyanate, epoxy, benzocyclobutene, polyimide, fluoropolymer and dicyanate;
    about 25 to about 65 volume percent of hollow inorganic microsphere filler wherein the filler has a maximum diameter of less that 40 microns;
    a silane coupling agent; and
    about 8 to about 27 volume percent of reinforcement material, the circuit board also including at least one layer of conductive material disposed on at least a portion thereof, all in amounts relative to each such that the overall dielectric constant is below 3.2.

9. The prepreg material recited in claim 1, comprising in addition a substance which imparts flame retardance to the material.

10. The prepreg material recited in claim 9, wherein the substance which imparts flame retardance comprises an antimony or halogen compound.

11. The prepreg material recited in claim 9, wherein the substance which imparts flame retardance comprises a brominated polyglycidyl ether of bisphenol A.

12. The prepreg material recited in claim 10 wherein the polymer resin is an epoxy and the halogen compound comprises about 19% to about 23% by weight of bromine.

13. The prepreg material recited in claim 1, wherein the polymer resin is an epoxy resin and the microspheres are present in an amount between about 37 and 46% by volume.

* * * * *